United States Patent
Cheng et al.

(10) Patent No.: US 11,530,476 B2
(45) Date of Patent: Dec. 20, 2022

(54) DEVICE FOR SPUTTERING

(71) Applicant: Applied Nano Technology Science, Inc., Qionglin Township (TW)

(72) Inventors: Tien-Chun Cheng, Qionglin Township (TW); Wen-Pin Lai, Qionglin Township (TW); Hsin-Hsuan Huang, Qionglin Township (TW); Yu-Ching Huang, Qionglin Township (TW); Ta-Jung Su, Qionglin Township (TW)

(73) Assignee: APPLIED NANO TECHNOLOGY SCIENCE, INC., Qionglin Township (TW)

( * ) Notice: Subject to any disclaimer, the term of this patent is extended or adjusted under 35 U.S.C. 154(b) by 0 days.

(21) Appl. No.: 17/061,327

(22) Filed: Oct. 1, 2020

(65) Prior Publication Data
US 2022/0106680 A1    Apr. 7, 2022

(51) Int. Cl.
*H01J 37/34* (2006.01)
*C23C 14/35* (2006.01)

(52) U.S. Cl.
CPC ........ *C23C 14/352* (2013.01); *H01J 37/3405* (2013.01); *H01J 37/3452* (2013.01); *H01J 37/3455* (2013.01)

(58) Field of Classification Search
CPC .. H01J 37/345; H01J 37/3452; H01J 37/3455; H01J 37/3461
USPC ...................................... 204/298.21, 298.22
See application file for complete search history.

(56) References Cited

U.S. PATENT DOCUMENTS

| | | | | |
|---|---|---|---|---|
| 8,647,486 B2 * | 2/2014 | Malaszewski | ...... | H01J 37/3405 204/298.21 |
| 8,652,310 B2 * | 2/2014 | McLeod | ............... | H01J 37/342 204/298.21 |
| 8,951,394 B2 * | 2/2015 | Bernick | .................. | C23C 14/35 204/298.16 |
| 2004/0129561 A1 * | 7/2004 | Barrett | ................ | H01J 37/3405 204/298.21 |
| 2005/0109616 A1 * | 5/2005 | Ohta | ..................... | C23C 14/352 204/298.18 |
| 2012/0048724 A1 * | 3/2012 | McLeod | ............. | H01J 37/3452 204/192.12 |

FOREIGN PATENT DOCUMENTS

JP    2019-094533    * 6/2019

OTHER PUBLICATIONS

Machine Translation of JP 2019-094533 (Year: 2019).*

* cited by examiner

*Primary Examiner* — Rodney G McDonald
(74) *Attorney, Agent, or Firm* — Muncy, Geissler, Olds & Lowe, P.C.

(57) ABSTRACT

The invention provides a device for sputtering comprising a main magnet, two secondary magnets mounted on two sides of the main magnet symmetrically, and a shell. The two secondary magnets face to each other in ends with the same polarity in a line. The shell is cylindrical and contains the main magnet and the secondary magnets.

12 Claims, 9 Drawing Sheets

DEVICE FOR SPUTTERING

TECHNICAL FIELD

The present invention relates generally to sputtering devices, and more particularly to devices for rotating sputtering.

BACKGROUND OF THE INVENTION

When sputtering, the plasma electrons bombard the target along the magnetic lines of force, and only the area of the target covered by the magnetic field suffers electron bombardment. A rotating sputtering device not only provides fixed magnetic field but also rotates the target to change the area of the target bombarded by electrons. Thus, the surface of the target can be sputtered even without heat accumulation resulted from prolonged sputtering.

However, the traditional rotating sputtering device cannot provide magnetic field with enough magnitude required today. Therefore, there is a requirement for a rotating sputtering device providing magnetic field with enough magnitude.

Additional objects and advantages of the invention will be set forth in the description which follows, and in part will be obvious from the description or will be learned from practice of the invention. The objects and advantages of the invention may be realized and obtained by means of the instrumentalities and combinations particularly pointed out in the claims.

SUMMARY

One aspect of the present disclosure provides a device for sputtering comprising: a bar, wherein the bar is made of high-permeability material; magnets mounted on two sides of the bar symmetrically, wherein the magnets face to each other in ends with the same polarity in a line; and a shell which is cylindrical and contains the bar and the magnets.

Another aspect of the present disclosure provides a device for sputtering comprising: a main magnet; two secondary magnets mounted on two sides of the main magnet symmetrically, wherein the two secondary magnets face to each other in ends with the same polarity in a line; and a shell containing the main magnet and the secondary magnets.

Another aspect of the present disclosure provides a device for sputtering comprising: a shell which is cylindrical; and magnets inside the shell, wherein the magnets are mounted on two sides of a normal line of an inner surface of the shell symmetrically, and the magnets face to each other in ends with the same polarity in a line.

The experiments show that the device for rotating sputtering recited in the is present disclosure can provide magnetic field with higher magnetic flux density than the traditional sputtering device. Further, the device for rotating sputtering recited in the present disclosure can simplify the structure and steps to assemble the magnets and thus reduce the production cost.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
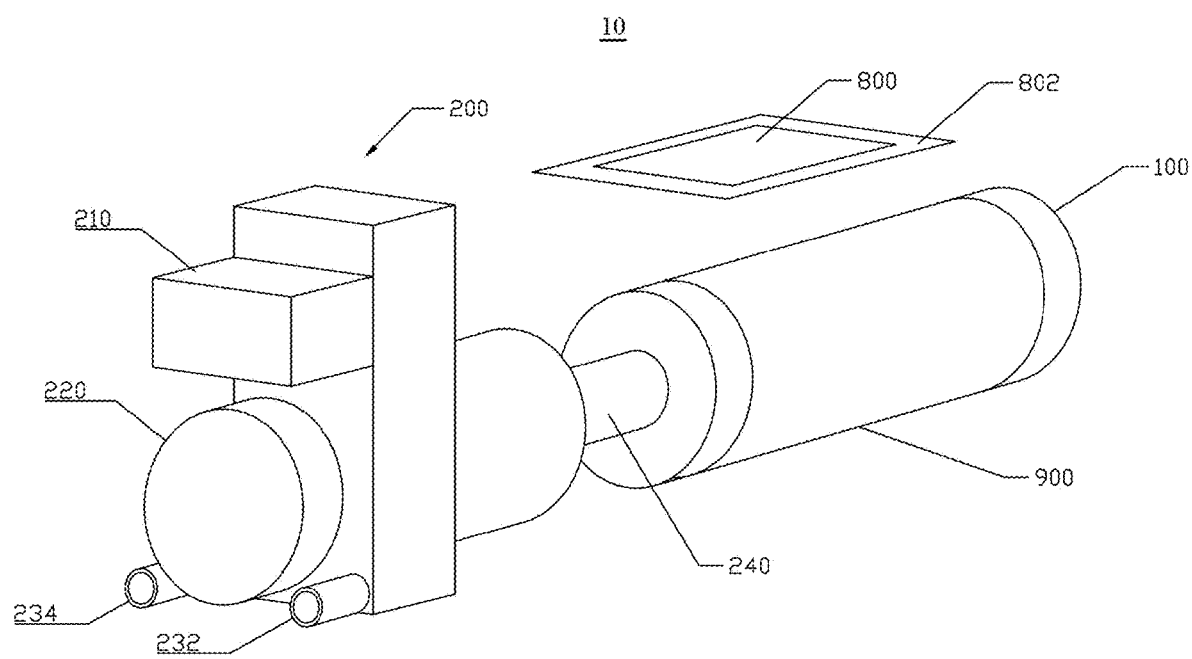
FIG. 1 is a perspective view showing a device for rotating sputtering in accordance with an embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a perspective view showing a device 10 for rotating sputtering in accordance with an embodiment of the present disclosure. Referring to FIG. 1, the device 10 for sputtering target comprises a magnetic assembly 100, a driving assembly 200, and a substrate holder 800. The driving assembly 200 comprises a controlling unit 210, a driver 220, a liquid inlet 232 and a liquid outlet 234. The controlling unit 210 controls the driver 220 to rotate the target 900 through the shaft 240. A cooling liquid flows into the liquid inlet 232, and then flows into the magnetic assembly 100 through the shaft 240. After the cooling liquid takes heat generated inside the magnetic assembly 100, the cooling liquid flows into the shaft 240 and then leaves the shaft 240 via the liquid outlet 234.

The magnetic assembly 100 provides a magnetic field. When sputtering, the plasma electrons bombard the target 900 along the magnetic lines of force to generate required atoms to form films on the substrate 802 held by the substrate holder 800. The target 900 keeps rotating to make the plasma electrons bombard every part of the target 900, and the surface of the target 900 can be bombarded evenly by plasma without heat accumulation resulted from the prolonged sputtering.

Figure 2:
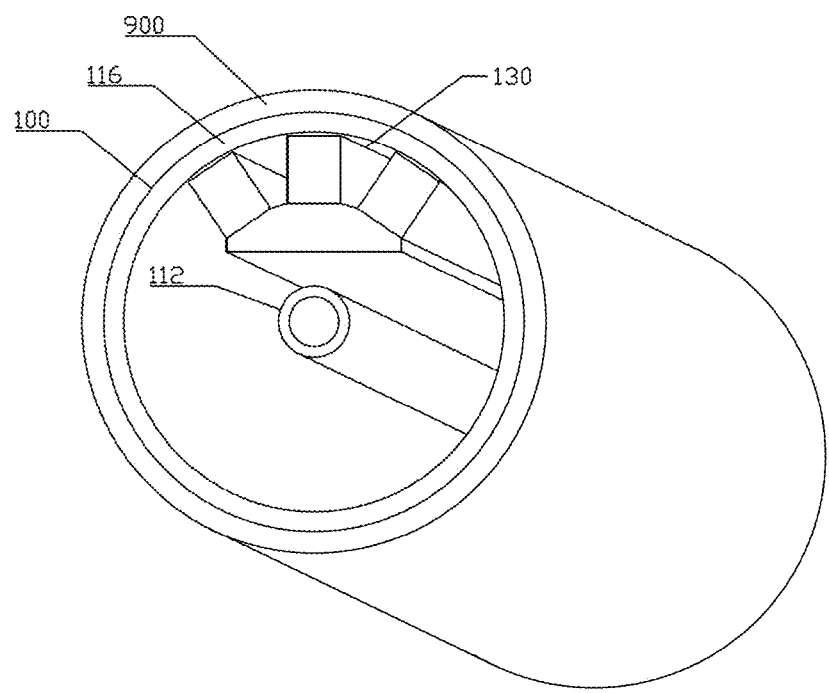
FIG. 2 is a perspective view showing a cross-section of the magnetic is assembly for generating magnetic field in accordance with an embodiment of the present disclosure.

FIG. 2 is a perspective view showing a cross-section of the magnetic assembly 100 for generating magnetic field in accordance with an embodiment of the present disclosure. Referring to FIG. 2, the magnetic assembly 100 comprises a magnetic module 130, a shell 116, and an axis 112. In one embodiment, the shell 116 is a cylindrical shell 116. A roll of a sputter target 900 covers the shell 116 and is attached on the shell 116 by Indium or any other bonding materials. The shell 116 is rotated by a shaft 240 powered by a driver 220 shown in FIG. 1.

Figure 3:
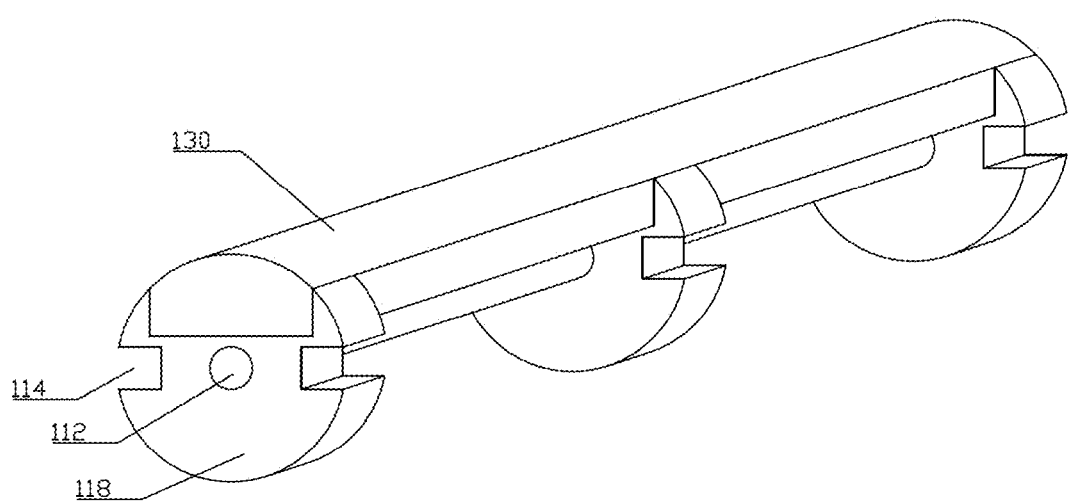
FIG. 3 is a perspective view showing the magnetic assembly for generating magnetic field in accordance with an embodiment of the present disclosure.

FIG. 3 is a perspective view showing the magnetic assembly 100 for generating magnetic field in accordance with an embodiment of the present disclosure. FIG. 3 illustrates that the magnetic assembly 100 comprises a bracket 118. The bracket 118 is mounted on the axis 112 to support the magnetic module 130, and the bracket 118 has notches 114 to allow cooling water from the liquid inlet 232 shown in FIG. 1 to flow through.

Figure 4:
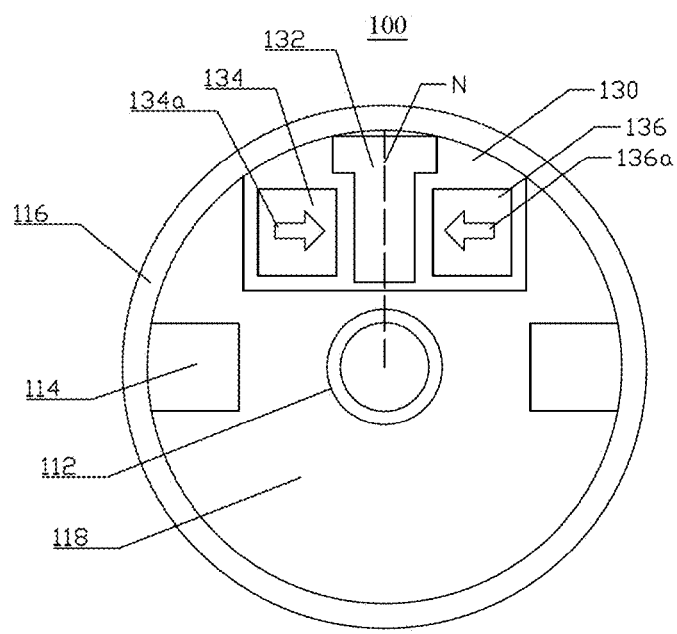
FIG. 4 is a cross-sectional view showing the magnetic assembly for generating magnetic field in accordance with an embodiment of the present disclosure.

FIG. 4 is a cross-sectional view showing the magnetic assembly 100 for generating magnetic field in accordance with an embodiment of the present disclosure. Referring to FIG. 4, the magnetic assembly 100 comprises a bar 132, magnets 134, 136, and a shell 116. In one embodiment, the bar 132 may be made of high-permeability material and thus have high permeability. In one embodiment, the bracket 118 is mounted on two ends of the axis 112 for supporting the bar 132 and the magnets 134, 136. The magnets 134, 136 are mounted on two sides of the bar 132 symmetrically. The bar 132 and the magnets 134, 136 are mounted on the bracket 118 inside the shell 116, and the shell 116 can be rotated around the axis 112. The magnets 134, 136 face to each other in ends with the same polarity, and the is magnets 134, 136 are in a line. In other words, the magnets 134, 136 are mounted on two sides of a normal line N of an inner surface of the shell 116 symmetrically, and the bar 132 is mounted in the normal line N. For example, the magnets 134, 136 may face to each other in ends of north pole. In other words, the magnets 134, 136 may be disposed in directions of the magnetic field 134a, 134b, respectively. Alternatively, the magnets 134, 136 may face to each other in ends of south pole.

Optionally, the bracket 118 is not made of high-permeability material, and has notches 114 to allow cooling water to penetrate the bracket 118 inside the shell 116 for cooling the shell 116 and the target attached to the shell 116. After the cooling water takes heat generated inside the magnetic assembly 100 and surrounding shell 116 and target 900, the cooling water flows into the axis 112 and then returns back to the shaft 240 and the liquid outlet 234 shown in FIG. 1.

Figure 5:
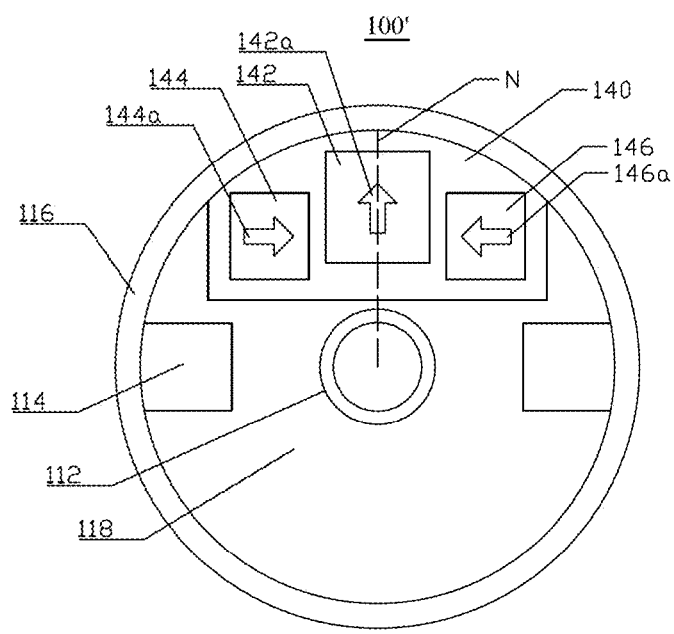
FIG. 5 is a cross-sectional view showing the magnetic assembly for generating magnetic field in accordance with another embodiment of the present disclosure.

FIG. 5 is a cross-sectional view showing the magnetic assembly 100' for generating magnetic field in accordance with another embodiment of the present disclosure. Referring to FIG. 5, the magnetic assembly 100' comprises a main magnet 142, secondary magnets 144, 146, and shell 116. The secondary magnets 144, 146 are mounted on two sides of the main magnet 142 symmetrically. The main magnet 142 and the secondary magnets 144, 146 are mounted on the bracket 118 inside the shell 116, and the shell 116 can be rotated around the axis 112. The secondary magnets 144, 146 face to each other in ends with the same polarity, and the secondary magnets 144, 146 are in a line. In other words, the secondary magnets 144, 146 are mounted on two sides of a normal line N of an inner surface of the shell 116 symmetrically, and the main magnet 142 is mounted in the normal line N. For example, the secondary magnets 144, 146 may face to each other in ends of north pole. In other words, the secondary magnets 144, 146 may be disposed in directions of the magnetic field 144a, 144b, respectively. Alternatively, the secondary magnets 144, 146 may face to each other in ends of south pole.

Optionally, the main magnet 142 may face to center of the shell 116 in an end of south pole. In other words, the main magnet 142 may be disposed in a direction of the magnetic field 142a.

By referring to FIG. 5, the magnetic flux density generated by the magnetic module 140 of the magnetic assembly 100' is generated by the main magnet 142 and can be enforced by the secondary magnets 144, 146.

Figure 6A:
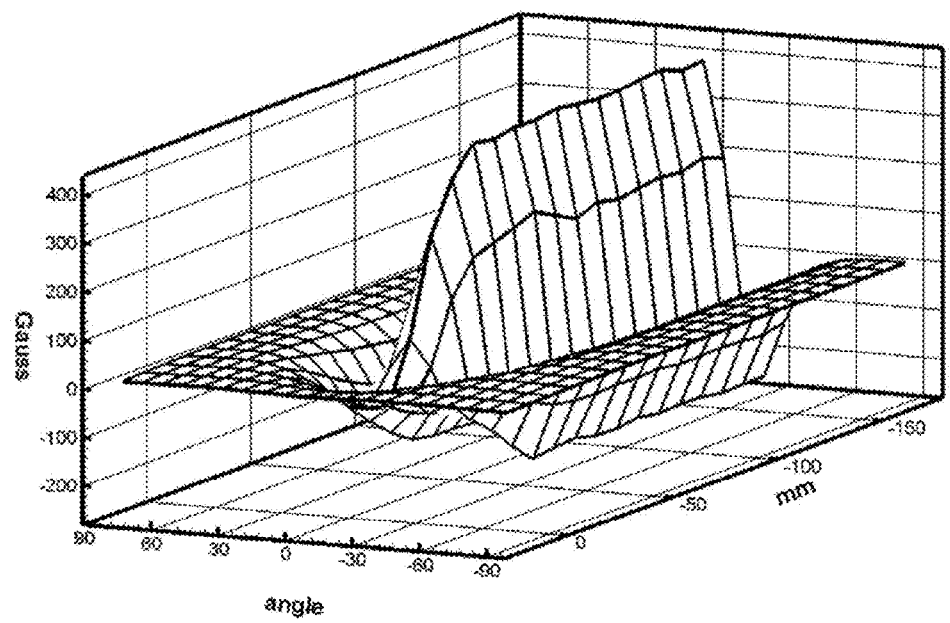
FIG. 6A is a diagram showing the magnetic flux density along the normal line of the surface of the shell while the magnetic field is generated by a traditional magnetic assembly.
Figure 6B:
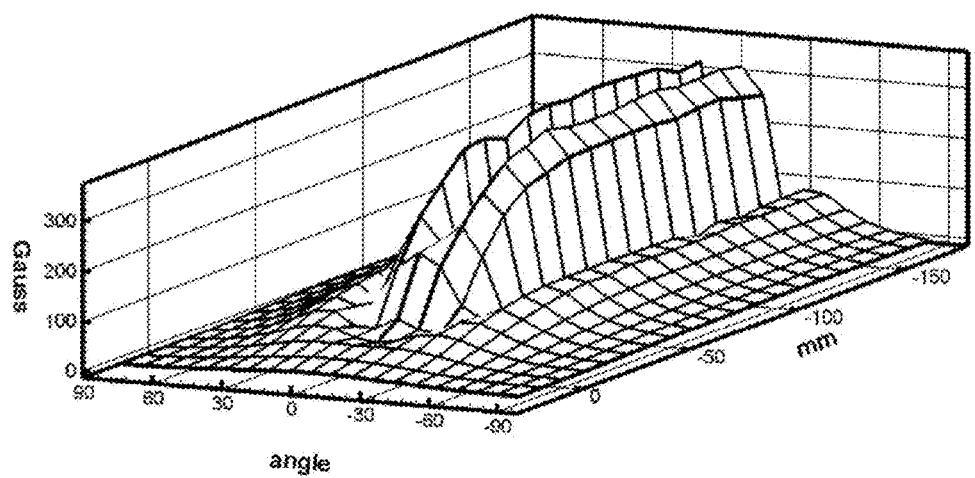
FIG. 6B is a diagram showing the magnetic flux density along the tangent line of the surface of the shell while the magnetic field is generated by the traditional magnetic assembly.
Figure 7A:
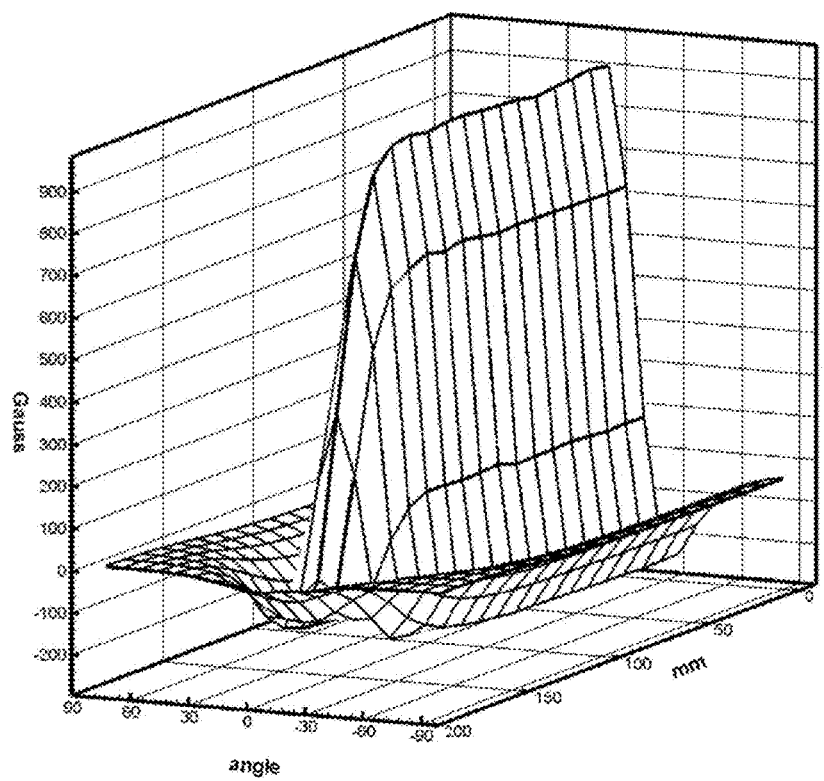
FIG. 7A is a diagram showing the magnetic flux density along the normal line of the surface of the shell while the magnetic field is generated by the magnetic assembly shown in FIG. 5.
Figure 7B:
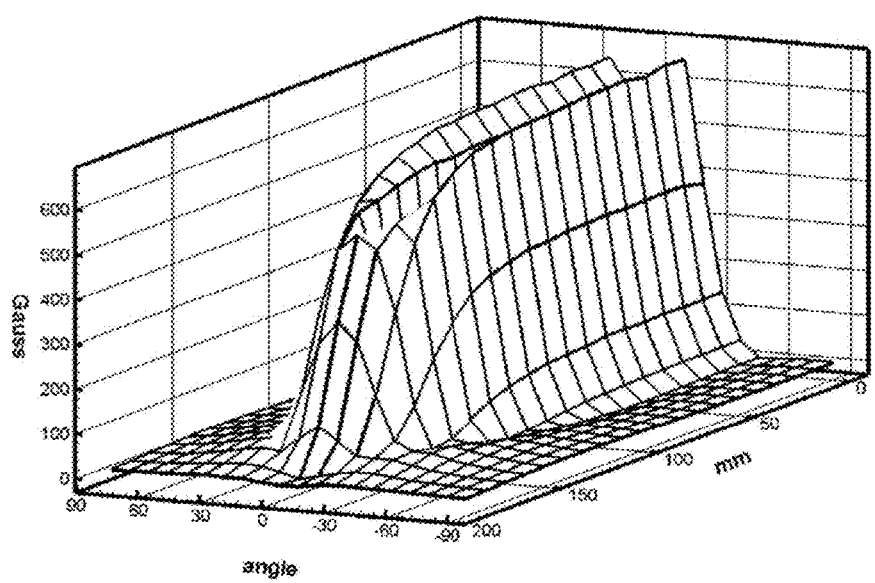
FIG. 7B is a diagram showing the magnetic flux density along the tangent line of the surface of the shell while the magnetic field is generated by the magnetic assembly shown in FIG. 5.

FIG. 6A is a diagram showing the magnetic flux density along the normal line N of the surface of the shell while the magnetic field is generated by the traditional magnetic assembly. FIG. 6B is a diagram showing the magnetic flux density along the tangent line of the surface of the shell while the magnetic field is generated by the traditional magnetic assembly. FIG. 7A is a diagram showing the magnetic flux density along the normal line N of the surface of the shell while the magnetic field is generated by the magnetic assembly 100' shown in FIG. 5. FIG. 7B is a diagram showing the magnetic flux density along the tangent line of the surface of the shell while the magnetic field is generated by the magnetic assembly 100' shown in FIG. 4. By comparing FIG. 6A with FIG. 7A, and comparing FIG. 6B with FIG. 7B, it shows that the magnetic field generated by the magnetic assembly in the present disclosure is stronger than that generated by the traditional magnetic assembly along both of the normal line and the tangent line of the surface of the shell.

Based on the above-mentioned structure, the experiments show that the present disclosure can provide magnetic field with higher magnetic flux density than the traditional sputtering device. Further, the device for rotating sputtering recited in the present disclosure can simplify the structure and steps to assemble the magnets and thus reduce the production cost.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, is the appended claims are intended to include within their scope such processes, machines, manufacture, compositions of matter, means, methods, or steps.

What is claimed is:

1. A device for sputtering, comprising:
   a main magnet;
   two secondary magnets mounted on two sides of the main magnet symmetrically, wherein the two secondary magnets face to each other with the same polarity facing each other in a line, and the two secondary magnets are arranged in a line crossing the main magnet; and
   a shell which is cylindrical and contains the main magnet and the secondary magnets,
   wherein a base of the main magnet is in a higher level than bases of the two secondary magnets.

2. The device of claim 1, wherein the south pole of the main magnet faces the center of the shell.

3. The device of claim 1, further comprising:
   an axis inside the shell, wherein the axis is hollow to allow a cooling liquid to flow through; and
   a bracket mounted by two ends of the axis for supporting the bar and the magnets.

4. The device of claim 3, wherein the bracket is not made of high-permeability material having higher permeability than air.

5. The device of claim 3, wherein the bracket further comprises notches to allow the cooling liquid to flow through.

6. The device of claim 1, further comprising:
   a roll of a sputter target covering and attached on the shell; and
   a driver for rotating the shell.

7. The device of claim 1, wherein the north poles of the two secondary magnets face each other.

8. The device of claim 1, wherein the south poles of the two secondary magnets face each other.

9. The device of claim 6, further comprising a holder for holding a substrate over the shell and the roll of the sputter target.

10. A device for sputtering, comprising:
    a shell which is cylindrical;
    magnets inside the shell, wherein the magnets are mounted on two sides of a normal line of an inner surface of the shell symmetrically, and the magnets face to each other with the same polarity facing each other in a line, and
    a bar which is T-shaped and mounted along the normal line, wherein the bar has a wide end and a narrow end opposite the wide end, the wide end is positioned toward the inner surface of the shell, and the narrow end is positioned toward the center of the shell.

11. The device of claim 10, wherein the bar is made of high-permeability material having higher permeability than air.

12. The device of claim 10, wherein the bar is a magnet.

* * * * *